(12) United States Patent
Inoue et al.

(10) Patent No.: US 6,323,577 B1
(45) Date of Patent: Nov. 27, 2001

(54) SAW DEVICE

(75) Inventors: Kenji Inoue; Katsuo Sato, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/420,938

(22) Filed: Oct. 19, 1999

(51) Int. Cl.$^7$ .................................................. H01L 41/04
(52) U.S. Cl. ........................................................ 310/313 A
(58) Field of Search ................................ 310/313 A, 360

(56) References Cited

U.S. PATENT DOCUMENTS 6,097,131 * 8/2000 Naumenko et al. ............. 310/313 A

OTHER PUBLICATIONS

Pisarevsky et al, Elastic, Piezoelectric, Dielectric Properties La3Ga5.5Ta0.5O14 Single Crystals, 1998 IEEE International Frequency Control Symposium 742–747 (May 27–29, 1998).* da Cunha et al, Surface and Pseudo Surface Acoustic Waves in Langatate, 1999 IEEE Utrasonics Symposium 169–172 (Oct. 17–20, 1999).*

Extended Abstracts of the Japanese Society of Applied Physics and Related Societies, 3 pages, "New Langasite--Type Piezoelectric Crystals (I): Growth and Characterizations of Large Size $La_3Ta_{0.5}Ga_{5.5}O_{14}$ Crystals," Mar. 28, 1997 (with Concise Explanation).

R.C. Smythe, IEEE International Frequency Control Symposium, pp. 761–765, "Material and Resonator Properties of Langasite and Langatate: A Progress Report," 1998.

* cited by examiner

Primary Examiner—Nestor Ramirez
Assistant Examiner—Peter Medley
(74) Attorney, Agent, or Firm—Oblon, Spivak, McClelland, Maier & Neustadt, P.C.

(57) ABSTRACT

A SAW device has interdigital electrodes on a substrate, wherein the substrate is obtained by slicing a single crystal represented by the chemical formula: $La_3Ta_{0.5}Ga_{5.5}O_{14}$ (LTG) at a cut angle. The cut angle and the direction of propagation of SAW along the substrate are optimized so that the substrate may have a low SAW velocity and an increased electromechanical coupling constant. This enables to reduce the size of the SAW device and broaden the pass-band width thereof as a filter, providing satisfactory characteristics especially as a SAW filter of intermediate frequency for mobile communication terminals. The SAW device has a minimal loss since SAW energy concentrates in the propagation direction.

4 Claims, 3 Drawing Sheets

X CUT, Y DIRECTION PROPAGATION

Y CUT, X DIRECTION PROPAGATION

SAW DEVICE

BACKGROUND OF THE INVENTION

In these years, mobile communication terminals including cellular phones marked a rapid market increase. For purposes of portability, these terminals are desired to be of small size and light weight. For the manufacture of small-sized, lightweight terminals, the size and weight of electronic parts used herein must be reduced. Surface-acoustic-wave (SAW) devices, specifically SAW filters are often used in high and intermediate-frequency portions of such terminals because SAW devices are advantageous for size and weight reductions. The SAW devices include interdigital electrodes formed on a surface of a piezoelectric substrate for exciting, receiving, reflecting and propagating surface acoustic waves.

Important characteristics of the piezoelectric substrate used in SAW devices include a propagation velocity of surface acoustic waves (SAW velocity) and an electromechanical coupling constant ($k^2$). The characteristics of some typical known substrates for SAW devices are given in Table 1. For the detail of these characteristics, reference should be made to Yasutaka SHIMIZU,"Propagation characteristics of SAW materials and their current application," Journal of the Electronic Information and Communication Society A, vol. J76-A, No 2, pp. 129–137 (1993). Hereinafter, the piezoelectric substrates for SAW devices are referred to using the designations in Table 1.

TABLE 1

| Designation | Composition | Cut angle | Propagation direction | SAW velocity (m/s) | $k^2$ (%) |
| --- | --- | --- | --- | --- | --- |
| 128LN | LiNbO$_3$ | 128° rotated Y | X | 3880–3920 | 5.6 |
| 64LN | LiNbO$_3$ | 64° rotated Y | X | 4330–4360 | 11 |
| LT112 | LiTaO$_3$ | X | 112° rotated Y | 3220–3260 | 0.72 |
| 36LT | LiTaO$_3$ | 36° rotated Y | X | 4100–4160 | 5.0 |
| ST quartz | quartz | ST | X | 3130–3155 | 0.17 |

As seen from Table 1, 64LN and 36LT have a SAW velocity of higher than 4,000 m/s and are suitable for constructing filters in high-frequency portions of terminals for the following reason. For mobile communications as typified by cellular phones, a variety of systems have been used in the world. All these systems utilize frequencies of about 1 GHz. Then the filter used in the terminal high-frequency portion has a center frequency of about 1 GHz. In the case of SAW filters, the center frequency is approximately in proportion to the SAW velocity of the piezoelectric substrate used and in inverse proportion to the width of fingers of electrodes on the substrate. For higher frequencies, those substrates having a high SAW speed, for example, 64LN and 36LT are preferred. Also the filter in the high-frequency portion is required to have a wide band such as a pass-band width of more than 20 MHz. To broaden the band, the piezoelectric substrate must have a greater electromechanical coupling constant ($k^2$). From this aspect too, 64LN and 36LT are often used.

As the intermediate frequency of mobile communication terminals, a frequency band of 70 to 300 MHz is generally used. When the filter having a center frequency in this frequency band is constructed by a SAW filter utilizing 64LN or 36LT as the piezoelectric substrate, the width of fingers of electrodes on the substrate must be substantially greater than that in the filter used in the high-frequency portion.

This is illustrated by referring to the estimation of specific values. A SAW transducer constructing a SAW filter has an electrode finger width d, the SAW filter has a center frequency $f_0$, and the piezoelectric substrate used has a SAW velocity V, whose relationship is generally expressed by the equation:

$$f_0 = V/(4d) \quad (1).$$

When a SAW filter having a center frequency of 1 GHz is constructed using a piezoelectric substrate having a SAW velocity of 4000 m/s, the electrode finger width is calculated from equation (1) to be:

$$d = 4000(m/s)/(4 \times 1000(MHz)) = 1\ \mu m.$$

On the other hand, when an intermediate frequency filter having a center frequency of 100 MHz is constructed using a piezoelectric substrate having a SAW velocity of 4000 m/s, the electrode finger width is calculated to be:

$$d = 4000(m/s)/(4 \times 100(MHz)) = 10\ \mu m.$$

This indicates that the necessary electrode finger width is 10 times greater than in the filter of the high-frequency portion. A greater electrode finger width means that the SAW device itself becomes larger. In order that the SAW intermediate frequency filter be small in size, a piezoelectric substrate having a low SAW velocity V must be used as understood from equation (1).

As shown in Table 1, ST quartz is known as the piezoelectric substrate having a relatively low SAW velocity. ST quartz is known to have a SAW velocity of 3130 to 3155 m/s, although this value cannot be regarded definite because the effective SAW velocity of a piezoelectric substrate is affected by the structure of electrodes formed thereon. This SAW velocity is about ¾ of that of 64LN and 36LT and is advantageous for purposes of size reduction.

For the above-described reason, most SAW filters for intermediate frequency portions in mobile communication terminals are constructed of ST quartz piezoelectric substrates. As seen from Table 1, the ST quartz substrate has an electromechanical coupling constant ($k^2$) of 0.17%, which is extremely low among other piezoelectric substrates. A small value of $k^2$ means that only a filter having a very narrow pass-band is constructed.

Analog systems are mainly employed in the conventional mobile communications, namely cellular phones. Since these systems have a very narrow channel width, for example, of 12.5 kHz in the NTT system in Japan, 30 kHz in the AMPS system in the U.S., and 25 kHz in the TACS system in Europe, the low electromechanical coupling constant ($k^2$) of ST quartz substrates gives rise to no problem. However, from the standpoints of effective utilization of frequency resource and compatibility with digital data communication, a digital mobile communication system was recently developed. The digital system has matured to a practical level and become widespread. The channel width of the digital system is very broad, for example, 200 kHz in the cellular phone GSM system in Europe and 1.7 MHz in the cordless phone DECT system. When an intermediate-frequency filter with such a broad band is constructed by a SAW filter, it Is difficult to manufacture the filter using ST quartz substrates.

As described above, the prior art SAW devices have the problems that the use of a piezoelectric substrate having a high electromechanical coupling constant allows for a wider pass-band, but leads to a greater device size because of the greater SAW velocity of the substrate; and that when a substrate having a relative low SAW velocity is used for the purpose of reducing the device size, the pass-band width cannot be broaden because of a too low electromechanical coupling constant. Either case fails to achieve satisfactory characteristics as the intermediate-frequency SAW filter.

SUMMARY OF THE INVENTION

Therefore, an object of the invention is to provide a SAW device having a miniature size and a wide pass-band.

The invention provides a surface-acoustic-wave (SAW) device comprising a substrate and interdigital electrodes on a surface of the substrate, wherein said substrate is obtained by slicing a single crystal represented by the chemical formula: $La_3Ta_{0.5}Ga_{5.5}O_{14}$ (LTG) at a cut angle, and provided that the cut angle and the direction of propagation of surface acoustic waves along said substrate are represented by ($\phi$, $\theta$, $\Psi$) in Euler angle expression.

In a first embodiment, $\phi$, $\theta$, and $\Psi$ fall within the region 1-I where $\phi$ is from 85 to 95°, $\phi$ is from 85 to 95°, and $\Psi$ is from −40 to 40°.

In a second embodiment, $\phi$, $\theta$, and $\Psi$ fall within the region 1-II where $\phi$ is from −5 to 50°, $\theta$ is from 85 to 95°, and $\Psi$ is from −40 to 40°.

In a third embodiment, $\phi$, $\theta$, and $\Psi$ fall within the region 2-I where $\phi$ is from −5 to 5°, $\theta$ is from 130 to 180°, and $\Psi$ is from 20 to 40°.

In a fourth embodiment, $\phi$, $\theta$, and $\Psi$ fall within the region 2-II where $\phi$ is from 25 to 35°, is from 0 to 85°, and $\Psi$ is from −10 to 20°.

In a fifth embodiment, $\phi$, $\theta$, and $\Psi$ fall within one of the following regions:

as a group of regions $\phi 0$ with $\phi$ ranging from −5° to less than 5°, region $\phi 0$-1 where $\theta$ is from 95 to 130° and $\Psi$ is from 0 to 30°, region $\phi 0$-2 where $\theta$ is from 45 to 85° and $\Psi$ is from 0 to 15°, region $\phi 0$-3 where $\theta$ is from 0 to 85° and $\Psi$ is from 15 to 45°, region $\phi 0$-4 where $\theta$ is from 0 to 30° and $\Psi$ is from 75 to 90°, and region $\phi 0$-5 where $\theta$ is from 140 to 180° and $\Psi$ is from 75 to 90°, as a group of regions $\phi 10$ with $\phi$ ranging from 5° to less than 15°, region $\phi 10$-1 where $\theta$ is from 55 to 125° and $\Psi$ is from −40 to 40°, region $\phi 10$-2 where $\theta$ is from 125 to 180° and $\Psi$ is from −35 to −100°, region $\phi 10$-3 where $\theta$ is from 125 to 180° and $\Psi$ is from 20 to 55°, region $\phi 10$-4 where $\theta$ is from 0 to 55° and $\Psi$ is from −55 to −25°, region $\phi 10$-5 where $\theta$ is from 0 to 55° and $\Psi$ is from 5 to 35°, region $\phi 10$-6 where $\theta$ is from 0 to 25° and $\Psi$ is from 65 to 90°, and region $\phi 10$-7 where $\theta$ is from 130 to 180 and $\Psi$ is from −75 to −65°, as a group of regions $\phi 20$ with $\phi$ ranging from 15° to less than 25°, region $\phi 20$-1 where $\theta$ is from 50 to 120° and $\Psi$ is from −35 to 30°, region $\phi 20$-2 where $\theta$ is from 120 to 180° and $\Psi$ is from −30 to 0°, region $\phi 20$-3 where $\theta$ is from 140 to 180° and $\Psi$ is from 35 to 65°, region $\phi 20$-4 where $\theta$ is from 0 to 85° and $\Psi$ is from −60 to −35°, region $\phi 20$-5 where $\theta$ is from 0 to 50° and $\Psi$ is from −5 to 30°, region $\phi 20$-6 where $\theta$ is from 0 to 25° and $\Psi$ is from 55 to 900°, and region $\phi 20$-7 where $\theta$ is from 110 to 180° and $\Psi$ is from −65 to −55°, as a group of regions $\phi 30$ with $\phi$ ranging from 25° to less than 35°, region $\phi 30$-1 where $\theta$ is from 0 to 75° and $\Psi$ is from −60 to −40°, region $\phi 30$-2 where $\theta$ is from 0 to 30° and $\Psi$ is from 45 to 75°, region $\phi 30$-3 where $\theta$ is from 50 to 85° and $\Psi$ is from −30 to −10°, and region $\phi 30$-4 where $\theta$ is from 50 to 85° and $\Psi$ is from 20 to 30°.

BRIEF DESCRIPTION OF THE DRAWINGS

The above and other objects, features and advantages will be better understood by reading the following description taken in conjunction with the accompanying drawings.

DESCRIPTION OF THE PREFERRED EMBODIMENTS

Figure 1:
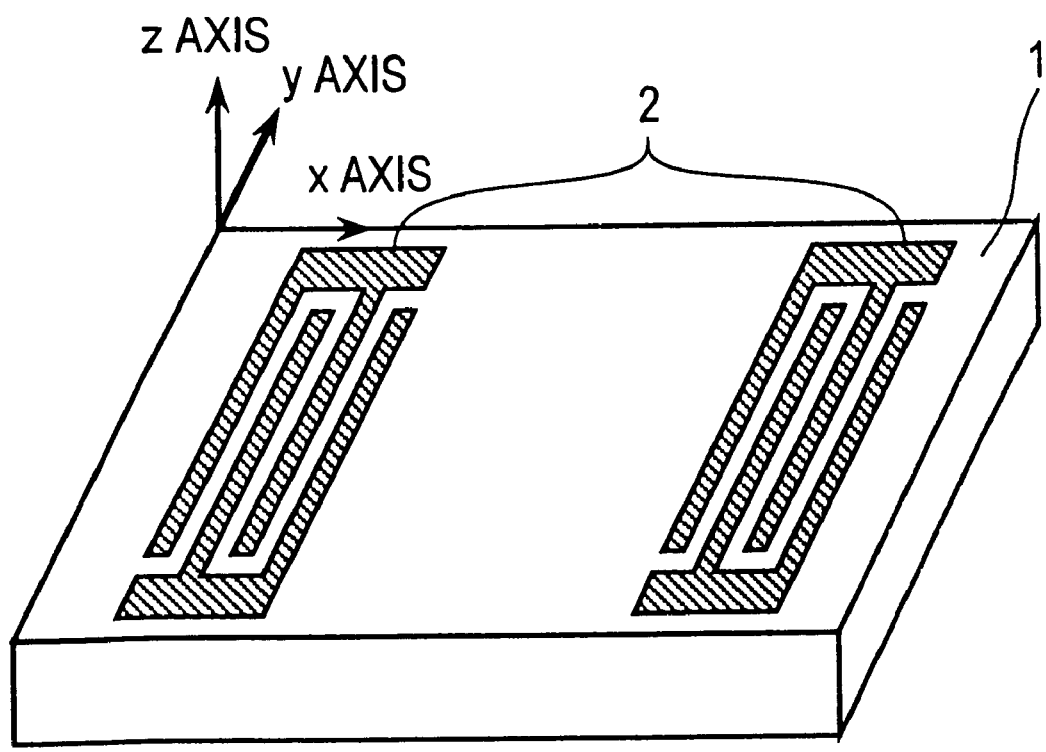
FIG. 1 is a perspective view of a SAW device according to one embodiment of the invention.

Referring to FIG. 1, there is illustrated a SAW device according to one embodiment of the invention. The SAW device has a set of interdigital electrodes 2 and 2 on a surface of a substrate 1. A slice of LTG single crystal is used as the substrate 1. The LTG single crystal is of the crystal type belonging to point group 32.

In the figure, axes x, y and z are orthogonal to each other. Axes x and y are in-plane directions of the substrate 1, with axis x assuming the direction of propagation of surface acoustic waves. Axis z which is perpendicular to the substrate surface prescribes the cut angle or face of the single crystal substrate. The relationship of these axes x, y and z to axes X, Y and Z of a LTG single crystal is represented by Euler angle expression ($\phi$, $\theta$, $\Psi$).

The LTG single crystal used herein is generally represented by the chemical formula: $La_3Ta_{0.5}Ga_{5.5}O_{14}$ and known as a substituted crystal of conventional well-known langasite ($La_3Ga_5SiO_{14}$). See the Preprint of the 44th Applied Physics Related Joint Meeting, No. 1, page 213 (1996), Speech No. 28p-N-1. In embodiments 1, 2 and 3 of the invention, when LTG single crystal is applied to the substrate of a SAW device, the cut direction of crystal and the propagation direction of SAW are properly selected to establish a SAW device with improved characteristics. The LTG single crystal may contain incidental impurities such as Al, Zr, Fe, Ce, Nd, Pt, and Ca. The method of preparing LTG single crystal is not critical and any conventional single crystal growth process such as the Czochralski (CZ) process may be used.

The size of the substrate is not critical. In most cases, the substrate has a dimension of about 4 to 10 mm in the SAW propagation direction, a dimension of about 2 to 4 mm in a direction perpendicular thereto, and a thickness of about 0.2 to 0.4 mm.

The interdigital electrodes 2 and 2 on the substrate 1 are thin film electrodes formed on the substrate as regular stripes for exciting, receiving, reflecting and propagating surface acoustic waves. The interdigital electrodes are patterned so that the propagation direction of SAW is aligned with the predetermined direction. Such interdigital electrodes may be formed from Au or Al by evaporation or sputtering. The interdigital electrodes have comb-tooth like fingers whose width may be properly determined in accordance with the frequency at which the SAW device is to be operated. For the preferred frequency band to which the invention is applicable, the finger width is generally about 2 to 10 $\mu$m.

The SAW device of the invention is generally suited as a filter in a frequency band of 10 to 500 MHz, and especially 10 to 300 MHz. Because of a low SAW velocity, the SAW device of the invention is also effective in reducing the size of a SAW delay device.

It is noted that since the LTG single crystal is trigonal, there exist equivalent combinations of Euler angles due to the crystal symmetry. In a trigonal crystal substrate, $\phi=120$ to 240° and $\phi=240$ to 360° (−120 to 0°) are equivalent to $\phi=0$ to 120°; $\theta=360$ to 180° (0 to −180°) is equivalent to $\theta=0$ to 180°; and $\Psi=270$ to 90° is equivalent to $\Psi=-90$ to 90°. For example, $\phi=130°$ and $\phi=250°$ are are equivalent to $\phi=10°$; $\theta=330°$ is equivalent to $\phi=30°$; and $\Psi=240°$ is equivalent to $\Psi=60°$.

For the trigonal crystal substrate, its characteristics at all cut angles and in all propagation directions can be determined by examining in the range of $\phi=0$ to 30°.

Therefore, to determine the characteristics of a LTG single crystal substrate at all cut angles and in all propagation directions, examination may be made only in the range of $\phi_0=0$ to 30°, $\theta_0=0$ to 180°, and $\Psi_0=-90$ to 90°.

From this combination of ($\phi_0$, $\theta_0$, $\Psi_0$), equivalent combinations of ($\phi$, $\theta$, $\Psi$) exhibiting identical characteristics in the range of $\phi=30$ to 120° are known. Specifically described, a combination of ($\phi$, $\theta$, $\Psi$) equivalent to the combination of ($\phi_0$, $\theta_0$, $\Psi_0$) can be determined in the range of $30°\leq\phi\leq60°$, by the conversion of $\phi=60°-\phi_0$, $\theta=180°-\theta_0$, and $\Psi=\Psi_0$; in the range of $60°\leq\phi\leq90°$, by the conversion of $\phi=60°+\phi_0$, $\theta=180°-\theta_0$, and $\Psi=-\Psi$; and in the range of $90°\leq\phi\leq120°$, by the conversion of $\phi=120°-\phi_0$, and $\Psi=-\Psi_0$. On the basis of the above-described symmetry, the characteristics of all combinations of ($\phi$, $\theta$, $\Psi$) can be determined.

Illustrative examples of such equivalent combinations are given below. Combinations equivalent to (0°, 120°, 30°) are (60°, 60°, 30°), (60°, 60°, −30°), and (120°, 120°, −30°) as well as (0°, 120°, −30°) because $\phi=120°$ is equivalent to $\phi=0°$. Combinations equivalent to (10°, 70°, −20°) are (50°, 110°, −200°), (70°, 110°, 20°), and (110°, 70°, 20°).

It is noted that each of the regions specified herein encompasses equivalent combinations of ($\phi$, $\theta$, $\Psi$) determined in this way.

Next, Embodiments 1, 2, and 3 of the invention are described in detail.

Embodiment 1

Figure 2:
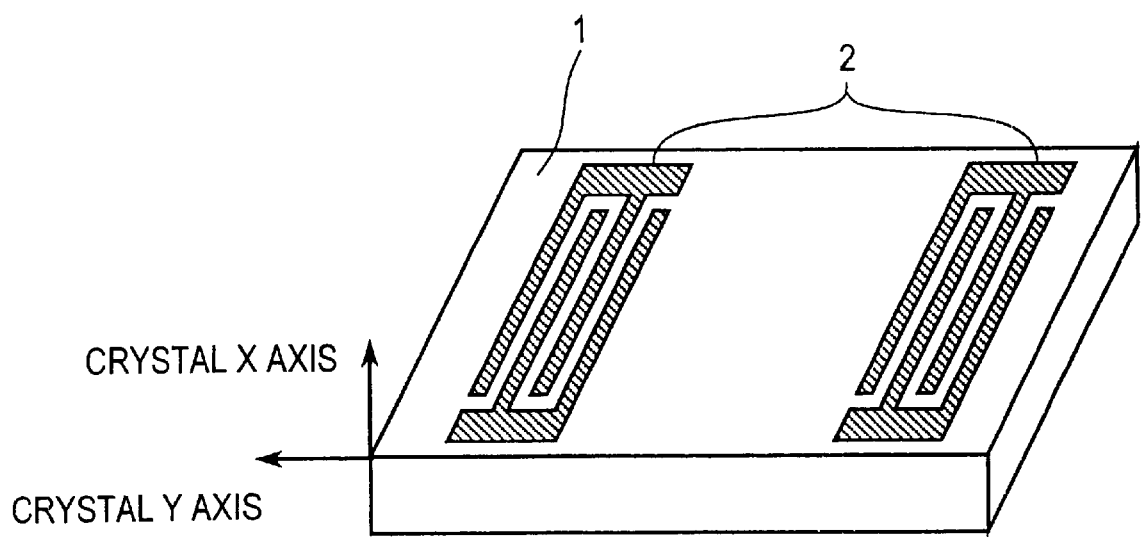
FIG. 2 is a perspective view of a SAW device according to embodiment 1-I of the invention.
Figure 3:
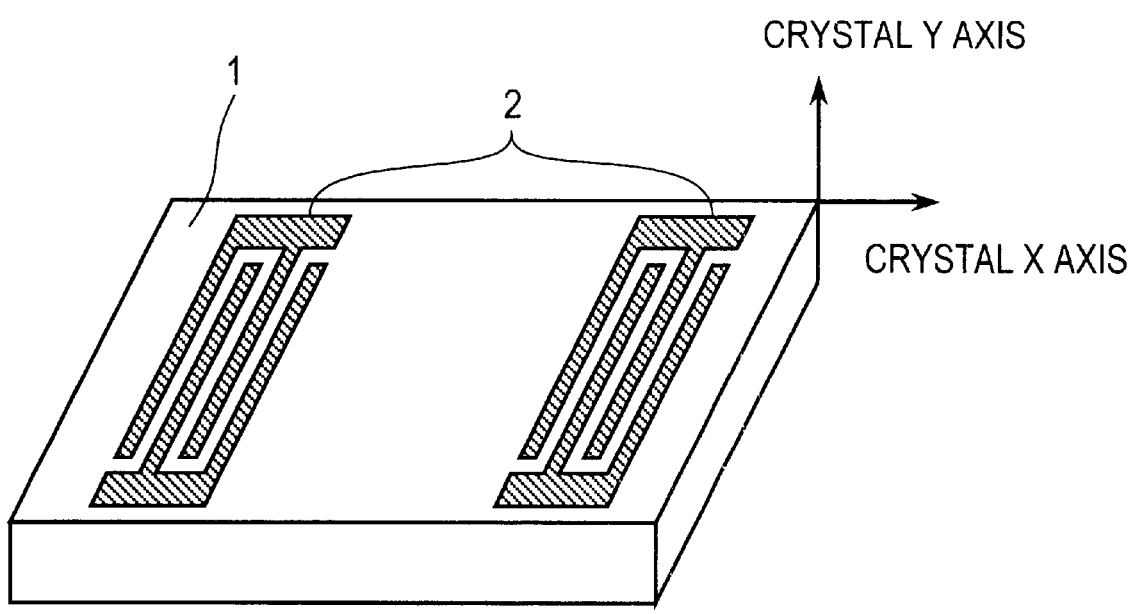
FIG. 3 is a perspective view of a SAW device according to embodiment 1-II of the invention.

Embodiment 1 includes embodiments 1-I and 1-II. FIG. 2 shows one exemplary construction of the SAW device of embodiment 1-I and FIG. 3 shows one exemplary construction of the SAW device of embodiment 1-II. These SAW devices each have a set of interdigital electrodes 2 and 2 on a surface of a substrate 1. The substrate used in embodiment 1-I is an X-cut LTG single crystal slice which is sliced perpendicular to X axis of the crystal as seen from FIG. 2. The substrate used in embodiment 1-II is a Y-cut LTG single crystal slice which is sliced perpendicular to Y axis of the crystal as seen from FIG. 3. The Euler angle expression prescribes the cut angle or plane of the single crystal substrate (or slice) and the propagation direction of surface acoustic waves. The X-cut LTG single crystal slice is represented by (90°, 90°, $\Psi$) in Euler angle expression. The Y-cut LTG single crystal slice is represented by (0°, 90°, $\Psi$) in Euler angle expression. When the cut angle and propagation direction in the SAW device of Embodiment 1 are represented by ($\phi$, $\theta$, $\Psi$), $\phi$, $\theta$, and $\Psi$ fall within the regions 1-I and 1-II.

Example 1-I

A LTG single crystal grown by the CZ process was cut perpendicular to X axis of the crystal as shown in FIG. 2, yielding a X-cut substrate. On the surface of the substrate, a set of interdigital electrodes were formed to construct a SAW transducer which is a SAW device of this example. The interdigital electrodes were formed by evaporating aluminum for both the input and output 30 electrodes. The electrodes had a thickness of 0.3 $\mu$m and 20 pairs of fingers which had a width d of 15 $\mu$m and a pitch (4d) of 60 $\mu$m.

The SAW propagation direction along the device is represented by (90°, 90°, $\Psi$) in Euler angle expression. While the value of $\Psi$ was changed from −50° to 50° at intervals of 10°, the SAW velocity and electromechanical coupling constant $k^2$ were measured in the directions corresponding to these eleven points. The SAW velocity was determined from the center frequency of the filter. The electromechanical coupling constant $k^2$ was determined by measuring a two-terminal admittance of SAW transducer and calculating in accordance with a well-known Smith equivalent circuit model. The results are shown in Table 2-1.

TABLE 2-1

| Region | $\phi$ (°) | $\theta$ (°) | $\psi$ (°) | SAW velocity (m/s) | Coupling constant (%) |
|---|---|---|---|---|---|
|  | 90 | 90 | −50 | 2325 | 0.06 |
| 1-I | 90 | 90 | −40 | 2286 | 0.18 |
| 1-I | 90 | 90 | −30 | 2297 | 0.46 |
| 1-I | 90 | 90 | −20 | 2337 | 0.93 |
| 1-I | 90 | 90 | −10 | 2368 | 1.26 |
| 1-I | 90 | 90 | 0 | 2403 | 1.32 |
| 1-I | 90 | 90 | 10 | 2466 | 1.15 |
| 1-I | 90 | 90 | 20 | 2543 | 0.77 |
| 1-I | 90 | 90 | 30 | 2613 | 0.41 |
| 1-I | 90 | 90 | 40 | 2658 | 0.17 |
|  | 90 | 90 | 50 | 2664 | 0.03 |

As seen from Table 2-1, when the SAW propagation direction is within the range of ±40° from Y axis, that is, $\Psi$ is from −40° to 40° in Euler angle expression (90°, 90°, $\Psi$), the SAW velocity is lower than 2,700 m/s and the electromechanical coupling constant $k^2$ is at least 0.17%, which is greater than the prior art ST quartz, which is advantageous in reducing the size and broadening the pass-band width of the SAW device. Moreover, when the SAW propagation direction is within the range of ±20° from Y axis, that is, $\Psi$ is from −20° to 20° in Euler angle expression (90°, 90°, $\Psi$), the SAW speed is lower than 2,600 m/s and the electromechanical coupling constant $k^2$ is more than 0.7%, which is at least 4 times greater than the prior art ST quartz, which is very advantageous in reducing the size and broadening the band of the SAW device.

Example 1-II

A LTG single crystal grown by the CZ process was cut perpendicular to Y axis of the crystal as shown in FIG. 3, yielding a Y-cut substrate. On the substrate surface, a set of interdigital electrodes were formed as in Example 1-I, constructing a SAW device.

The SAW propagation direction along the device is represented by (0°, 90°, Ψ) in Euler angle expression. While the value of Ψ was changed from −60° to 60° at intervals of 10°, the SAW velocity and electromechanical coupling constant $k^2$ were measured in the directions corresponding to these thirteen points. The results are shown in Table 2-2.

TABLE 2-2

| Region | φ (°) | θ (°) | ψ (°) | SAW velocity (m/s) | Coupling constant (%) |
|---|---|---|---|---|---|
|  | 0 | 90 | −60 | 2464 | 0.08 |
|  | 0 | 90 | −50 | 2417 | 0.15 |
| 1-II | 0 | 90 | −40 | 2408 | 0.31 |
| 1-II | 0 | 90 | −30 | 2416 | 0.58 |
| 1-II | 0 | 90 | −20 | 2390 | 0.87 |
| 1-II | 0 | 90 | −10 | 2320 | 0.98 |
| 1-II | 0 | 90 | 0 | 2281 | 0.99 |
| 1-II | 0 | 90 | 10 | 2320 | 0.98 |
| 1-II | 0 | 90 | 20 | 2390 | 0.87 |
| 1-II | 0 | 90 | 30 | 2416 | 0.58 |
| 1-II | 0 | 90 | 40 | 2408 | 0.31 |
|  | 0 | 90 | 50 | 2417 | 0.15 |
|  | 0 | 90 | 60 | 2464 | 0.08 |

As seen from Table 2-2, when the SAW propagation direction is X axis direction, that is, Ψ is 0° in Euler angle expression (0°, 90°, Ψ), the SAW velocity is lowest. It is thus seen that SAW propagates with its energy concentrated on X axis. That is, in the SAW device based on a Y-cut substrate and X direction propagation (represented by (0°, 90°, 0°) in Euler angle expression), the spreading of energy during propagation of SAW is suppressed so that the loss is advantageously reduced. Additionally, when the propagation direction is proximate X axis, the SAW velocity is lower than in Example 1-I, that is, lower than 2,500 m/s, which is more advantageous in reducing the size of the SAW device. When the SAW propagation direction is within the range of ±40° from X axis, that is, Ψ is from −40° to 40° in Euler angle expression (0°, 90°, Ψ), the electromechanical coupling constant is at least 0.3%, which is at least 2 times greater than the prior art ST quartz, contributing to size reduction and pass-band width broadening of the SAW device. Moreover, when the SAW propagation direction is within the range of ±20° from X axis, that is, Ψ is from −20° to 20° in Euler angle expression (0°, 90°, Ψ), the electromechanical coupling constant is at least 0.8%, which is at least 5 times greater than the prior art ST quartz. Consequently, the SAW device of embodiment 1-II has a further reduced size and broadened pass-band width.

Embodiment 2

When the cut angle and propagation direction in the SAW device of Embodiment 2 are represented by (φ, θ, Ψ), φ, θ, and Ψ fall within the regions 2-I and 2-II.

Example 2-I

A LTG single crystal grown by the CZ process was cut, yielding a LTG substrate. On the surface of the substrate, a set of interdigital electrodes were formed to construct a SAW transducer which is a SAW device of this example. The interdigital electrodes were formed by evaporating aluminum for both the input and output electrodes. The electrodes had a thickness of 0.3 μm and 20 pairs of fingers which had a width d of 15 μm and a pitch (4d) of 60 μm. In this way, a plurality of devices were prepared while changing the cut angle of the substrate and the SAW propagation direction.

When the cut angle of the substrate and the SAW propagation direction along the device are represented by (φ, θ, Ψ) in Euler angle expression, φ, θ, and Ψ are shown in Table 3-1. For these devices, the SAW velocity and electromechanical coupling constant $k^2$ were measured. The SAW velocity was determined from the center frequency of the filter. The electromechanical coupling constant $k^2$ was determined by measuring a two-terminal admittance of SAW transducer and calculating in accordance with a well-known Smith equivalent circuit model. The results are shown in Table 3-1.

TABLE 3-1

| Region | φ (°) | θ (°) | ψ (°) | SAW velocity (m/s) | Coupling constant (%) |
|---|---|---|---|---|---|
| 2-I | 0 | 140 | 25 | 2673 | 1.08 |
| 2-I | 0 | 170 | 30 | 2660 | 1.36 |
| 2-I | 0 | 180 | 20 | 2498 | 0.83 |
| 2-I | 0 | 180 | 40 | 2496 | 0.81 |

It is seen from Table 3-1 that in the range of region 2-I, there exist combinations of φ, θ, and Ψ within which the SAW velocity is lower than 2,700 m/s and the electromechanical coupling constant is at least 0.8%, which is at least 4.5 times greater than the prior art ST quartz, which is advantageous in reducing the size and broadening the pass-band width of the SAW device.

Example 2-II

As in Example 2-I, a plurality of SAW devices as shown in Table 3-2 were prepared. When the cut angle of the substrate and the SAW propagation direction along the device are represented by (φ, θ, Ψ) in Euler angle expression, φ, θ, and Ψ are shown in Table 3-2. For these devices, measurements were made as in Example 2-I. The results are shown in Table 3-2.

TABLE 3-2

| Region | φ (°) | θ (°) | ψ (°) | SAW velocity (m/s) | Coupling constant (%) |
|---|---|---|---|---|---|
| 2-II | 30 | 80 | 15 | 2360 | 1.14 |
| 2-II | 30 | 60 | 0 | 2435 | 1.04 |
| 2-II | 30 | 40 | 10 | 2515 | 1.74 |
| 2-II | 30 | 10 | 0 | 2601 | 1.38 |

It is seen from Table 3-2 that in the range of region 2-I, there exist combinations of φ, θ, and Ψ within which the SAW velocity is lower than 2,700 m/s and the electromechanical coupling constant is at least 1%, which is at least 5 times greater than the prior art ST quartz, which is advantageous in reducing the size and broadening the pass-band width of the SAW device. As compared with Example 2-I, the SAW velocity can be further reduced and the coupling constant can be further increased, which Is more advantageous for size reduction and pass-band width broadening.

Embodiment 3

When the cut angle of the substrate and the SAW propagation direction along the device of Embodiment 3 are represented by (φ, θ, Ψ), φ, θ and Ψ fall in the group of regions φ0 to the group of regions φ30.

In the group of regions φ0 to the group of regions φ30, there exist combinations of φ, θ, and Ψ within which the SAW velocity Is lower than 2,700 m/s and the electromechanical coupling constant is at least 0.4%. Also, in each of the regions:

φ0-1 to φ0-3,

φ10-1 to φ10-6,

φ20-1 to φ20-7, and

φ30-1 to φ30-4, there exist combinations of φ, θ, and Ψ within which the coupling constant is at least 0.8%. Further, in each of the regions:

φ0-3,

φ10-1 to φ10-6,

φ20-1 to φ20-7, and

φ30-2, there exist combinations of φ, θ, and Ψ within which the coupling constant is at least 1%.

Example 3

A LTG single crystal grown by the CZ process was cut, yielding a LTG substrate. On the substrate surface, a set of interdigital electrodes were formed to construct a SAW transducer which is a SAW device of this example. The interdigital electrodes were formed by evaporating aluminum for both the input and output electrodes. The electrodes had a thickness of 0.3 μm and 20 pairs of fingers which had a width d of 15 μm and a pitch (4d) of 60 μm. In this way, a plurality of devices were prepared while changing the cut angle of the substrate and the SAW propagation direction.

When the cut angle of the substrate and the SAW propagation direction along each device are represented by (φ, θ, Ψ) in Euler angle expression, φ, θ, and Ψ are shown in Tables 4-1 and 4-2.

For these devices, the SAW velocity and electromechanical coupling constant $k^2$ were measured. The SAW velocity was determined from the center frequency of the filter. The electromechanical coupling constant $k^2$ was determined by measuring a two-terminal admittance of SAW transducer and calculating in accordance with a well-known Smith equivalent circuit model. The results are shown in Tables 4-1 and 4-2.

TABLE 4-1

| Region | φ (°) | θ (°) | ψ (°) | SAW velocity (m/s) | Coupling constant (%) |
|---|---|---|---|---|---|
| φ0-1 | 0 | 100 | 30 | 2454 | 0.49 |
| φ0-1 | 0 | 120 | 30 | 2573 | 0.52 |
| φ0-1 | 0 | 100 | 0 | 2291 | 0.95 |
| φ0-1 | 0 | 120 | 0 | 2309 | 0.47 |
| φ0-2 | 0 | 50 | 0 | 2266 | 0.43 |
| φ0-2 | 0 | 50 | 10 | 2292 | 0.51 |
| φ0-2 | 0 | 70 | 0 | 2269 | 0.75 |
| φ0-2 | 0 | 70 | 10 | 2297 | 0.76 |
| φ0-3 | 0 | 0 | 20 | 2498 | 0.83 |
| φ0-3 | 0 | 0 | 40 | 2496 | 0.83 |
| φ0-3 | 0 | 20 | 30 | 2486 | 1.18 |
| φ0-3 | 0 | 60 | 30 | 2378 | 0.86 |
| φ0-3 | 0 | 70 | 20 | 2357 | 0.8 |
| φ0-3 | 0 | 70 | 40 | 2346 | 0.51 |

TABLE 4-1-continued

| Region | φ (°) | θ (°) | ψ (°) | SAW velocity (m/s) | Coupling constant (%) |
|---|---|---|---|---|---|
| φ0-4 | 0 | 0 | 80 | 2498 | 0.83 |
| φ0-4 | 0 | 20 | 80 | 2699 | 0.76 |
| φ0-5 | 0 | 170 | 80 | 2448 | 0.86 |
| φ10-1 | 10 | 70 | −20 | 2370 | 0.7 |
| φ10-1 | 10 | 70 | 0 | 2288 | 0.78 |
| φ10-1 | 10 | 70 | 20 | 2361 | 0.92 |
| φ10-1 | 10 | 90 | −20 | 2445 | 0.84 |
| φ10-1 | 10 | 90 | 0 | 2302 | 1.02 |
| φ10-1 | 10 | 90 | 20 | 2355 | 0.89 |
| φ10-1 | 10 | 110 | −20 | 2531 | 0.85 |
| φ10-1 | 10 | 110 | 0 | 2333 | 0.87 |
| φ10-1 | 10 | 110 | 20 | 2390 | 0.79 |
| φ10-2 | 10 | 130 | −30 | 2571 | 0.61 |
| φ10-2 | 10 | 130 | −20 | 2587 | 0.97 |
| φ10-2 | 10 | 130 | −10 | 2554 | 1.26 |
| φ10-2 | 10 | 170 | −20 | 2640 | 1.39 |
| φ10-3 | 10 | 170 | 40 | 2680 | 1.31 |
| φ10-3 | 10 | 140 | 40 | 2713 | 0.71 |
| φ10-4 | 10 | 20 | −40 | 2466 | 1.03 |
| φ10-4 | 10 | 40 | −40 | 2393 | 0.92 |
| φ10-5 | 10 | 20 | 20 | 2508 | 1.25 |
| φ10-5 | 10 | 40 | 10 | 2360 | 0.69 |
| φ10-5 | 10 | 40 | 30 | 2413 | 1.04 |
| φ10-6 | 10 | 0 | 75 | 2577 | 1.2 |
| φ10-7 | 10 | 170 | −70 | 2445 | 0.84 |

TABLE 4-2

| Region | φ (°) | θ (°) | ψ (°) | SAW velocity (m/s) | Coupling constant (%) |
|---|---|---|---|---|---|
| φ20-1 | 20 | 70 | −20 | 2407 | 0.62 |
| φ20-1 | 20 | 70 | 0 | 2343 | 0.89 |
| φ20-1 | 20 | 70 | 20 | 2364 | 1 |
| φ20-1 | 20 | 90 | −20 | 2509 | 0.8 |
| φ20-1 | 20 | 90 | 0 | 2357 | 1.14 |
| φ20-1 | 20 | 90 | 20 | 2340 | 0.91 |
| φ20-1 | 20 | 110 | −20 | 2534 | 0.73 |
| φ20-1 | 20 | 110 | 0 | 2415 | 1.22 |
| φ20-1 | 20 | 110 | 20 | 2353 | 0.82 |
| φ20-2 | 20 | 140 | −10 | 2538 | 1.06 |
| φ20-2 | 20 | 170 | −25 | 2418 | 0.49 |
| φ20-2 | 20 | 170 | −10 | 2620 | 1.39 |
| φ20-3 | 20 | 170 | 50 | 2699 | 1.24 |
| φ20-3 | 20 | 140 | 50 | 2750 | 0.45 |
| φ20-3 | 20 | 160 | 60 | 2610 | 0.79 |
| φ20-4 | 20 | 20 | −45 | 2411 | 1.03 |
| φ20-4 | 20 | 50 | −50 | 2383 | 0.68 |
| φ20-5 | 20 | 20 | 10 | 2532 | 1.28 |
| φ20-5 | 20 | 30 | 20 | 2497 | 1.3 |
| φ20-5 | 20 | 40 | 20 | 2460 | 1.34 |
| φ20-6 | 20 | 0 | 75 | 2577 | 1.2 |
| φ20-7 | 20 | 170 | −60 | 2443 | 0.84 |
| φ20-7 | 20 | 170 | −65 | 2491 | 1.08 |
| φ30-1 | 30 | 0 | −50 | 2498 | 0.83 |
| φ30-1 | 30 | 40 | −50 | 2416 | 0.7 |
| φ30-2 | 30 | 0 | 70 | 2498 | 0.83 |
| φ30-2 | 30 | 20 | 70 | 2642 | 0.79 |
| φ30-2 | 30 | 20 | 60 | 2744 | 0.7 |
| φ30-2 | 30 | 0 | 50 | 2497 | 0.83 |
| φ30-2 | 30 | 10 | 60 | 2717 | 1.15 |
| φ30-3 | 30 | 60 | −20 | 2422 | 0.5 |
| φ30-3 | 30 | 70 | −20 | 2470 | 0.62 |
| φ30-4 | 30 | 80 | 25 | 2321 | 0.67 |
| φ30-4 | 30 | 55 | 25 | 2368 | 0.63 |

As seen from Tables 4-1 and 4-2, in the region φ0 group to the region φ30 group, there exist combinations of φ, θ, and Ψ within which the SAW velocity is lower than 2,700 m/s and the electromechanical coupling constant is at least 0.4%, which is at least 2 times greater than the prior art ST quartz, which is advantageous in reducing the size and broadening the pass-band width of the SAW device. Moreover, in the region φ0 group to the region φ30 group, there exist combinations of φ, θ, and Ψ within which the SAW velocity is lower than 2,700 m/s and the electromechanical coupling constant is at least 1%, which is at least 5.5 times greater than the prior art ST quartz, which is very advantageous in reducing the size and broadening the pass-band width of the SAW device.

BENEFITS OF THE INVENTION

Embodiment 1

In both embodiments 1-I and 1-II, the substrate has a low SAW velocity and an increased electromechanical coupling constant, which enables to reduce the size of a SAW device and broaden the pass-band width as a filter. These characteristics are especially suitable as a SAW filter of intermediate-frequency in mobile communication terminals.

In embodiment 1-II, the energy of SAW concentrates in the propagation direction, the SAW device has a minimized loss.

Embodiment 2

When φ, θ, and Ψ are within region 2-I, the SAW velocity is low and the electromechanical coupling constant is increased, which enables to reduce the size of a SAW device and broaden the pass-band width as a filter. These characteristics are suitable as a SAW filter of intermediate-frequency in mobile communication terminals.

When φ, θ, and Ψ are within region 2-II, the SAW velocity is lower and the electromechanical coupling constant is larger, which enables to further reduce the size of a SAW device and broaden the pass-band width as a filter. These characteristics are especially suitable as a SAW filter of intermediate-frequency in mobile communication terminals.

Embodiment 3

When φ, θ, and Ψ are within the region φ0 group to the region φ30 group, the SAW velocity is low and the electromechanical coupling constant becomes significant, which enables to reduce the size of a SAW device and broaden the pass-band width as a filter. These characteristics are especially suitable as a SAW filter of intermediate-frequency in mobile communication terminals.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A surface-acoustic-wave device comprising a substrate and interdigital electrodes on a surface of the substrate, wherein said substrate is obtained by slicing a single crystal represented by the chemical formula: $La_3Ta_{0.5}Ga_{5.5}O_{14}$ at a cut angle, and provided that the cut angle and the direction of propagation of surface acoustic waves along said substrate are represented by (φ, θ, Ψ) in Euler angle expression, φ, θ, and Ψ fall within the region 1-I where φ is from 85 to 95°, θ is from 85 to 95°, and Ψ is from −40 to 40°.

2. A surface-acoustic-wave device comprising a substrate and interdigital electrodes on a surface of the substrate, wherein said substrate is obtained by slicing a single crystal represented by the chemical formula: $La_3Ta_{0.5}Ga_{5.5}O_{14}$ at a cut angle, and provided that the cut angle and the direction of propagation of surface acoustic waves along said substrate are represented by (φ, θ, Ψ) in Euler angle expression, φ, θ, and Ψ fall within the region 1-II where φ is from −5 to 5°, θ is from 85 to 95°, and Ψ is from −40 to 40°.

3. A surface-acoustic-wave device comprising a substrate and interdigital electrodes on a surface of the substrate, wherein said substrate is obtained by slicing a single crystal represented by the chemical formula: $La_3Ta_{0.5}Ga_{5.5}O_{14}$ at a cut angle, and provided that the cut angle and the direction of propagation of surface acoustic waves along said substrate are represented by (φ, θ, Ψ) in Euler angle expression, φ, θ, and Ψ fall within the region 2-II where φ is from 25 to 35°, θ is from 0 to 85°, and Ψ is from −10 to 20°.

4. A surface-acoustic-wave device comprising a substrate and interdigital electrodes on a surface of the substrate, wherein said substrate is obtained by slicing a single crystal represented by the chemical formula: $La_3Ta_{0.5}Ga_{5.5}O_{14}$ at a cut angle, and provided that the cut angle and the direction of propagation of surface acoustic waves along said substrate are represented by (φ, θ, Ψ) in Euler angle expression, φ, θ, and Ψ fall within one of the following regions:

as a group of regions φ10 with φ ranging from more than 5° to less than 15°, region φ10-1 where θ is from 55 to 125° and Ψ is from −40 to 40°, region φ10-2 where θ is from 125 to 180° and Ψ is from −35 to −10°, region φ10-3 where θ is from 125 to 180° and Ψ is from 20 to 55°, region φ10-4 where θ is from 0 to 55° and Ψ is from −55 to −25°, region φ10-5 where θ is from 0 to 55° and Ψ is from 5 to 35°, region φ10-6 where θ is from 0 to 25° and Ψ is from 65 to 90°, region φ10-7 where θ is from 130 to 180° and Ψ is from −75 to −65°, as a group of regions φ20 with φ ranging from 15° to less than 25°, region φ20-1 where θ is from 50 to 120° and Ψ is from −35 to 30°, region φ20-2 where θ is from 120 to 180° and Ψ is from −30 to 0°, region φ20-3 where θ is from 140 to 180° and Ψ is from 35 to 65°, region φ20-4 where θ is from 0 to 85 and Ψ is from −60 to −35°, region φ20-5 where θ is from 0 to 50° and Ψ is from −5 to 30°, region φ20-6 where θ is from 0 to 25° and Ψ is from 55 to 90°, and region φ20-7 where θ is from 110 to 180° and Ψ is from −65 to −55°, as a group of regions φ30 with φ ranging from 25° to less than 35° region φ30-1 where θ is from 0 to 75° and Ψ is from −60 to −40° region φ30-2 where θ is from 0 to 30° and Ψ is from 45 to 75° region φ30-3 where θ is from 50 to 85° and Ψ is from −30 to −10° region φ30-4 where θ is from 50 to 85° and Ψ is from 20 to 30°.

* * * * *